(12) United States Patent
Chang et al.

(10) Patent No.: US 6,316,347 B1
(45) Date of Patent: Nov. 13, 2001

(54) AIR GAP SEMICONDUCTOR STRUCTURE AND METHOD OF MANUFACTURE

(75) Inventors: Ting-Chang Chang, Hsinchu; Yi-Shien Mor, Taipei; Po-Tsun Liu, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/752,268

(22) Filed: Dec. 29, 2000

(30) Foreign Application Priority Data

Dec. 18, 2000 (TW) .................................................. 89127061

(51) Int. Cl.[7] .............................................. H01L 21/4763
(52) U.S. Cl. .......................... 438/619; 438/780; 438/781; 438/421; 438/422
(58) Field of Search .................................... 438/421, 422, 438/619, 780, 781

(56) References Cited

U.S. PATENT DOCUMENTS 6,165,890 * 12/2000 Kohl et al. ........................... 438/619

* cited by examiner

Primary Examiner—Richard Elms
Assistant Examiner—Beth E. Owens
(74) Attorney, Agent, or Firm—Thomas, Kayden, Horstmeyer & Risley

(57) ABSTRACT

An air gap semiconductor structure and corresponding method of manufacture. The method includes providing a substrate having metallic lines thereon. A high molecular weight sacrificial film is formed over the substrate. A portion of the high molecular weight sacrificial layer is removed to form spacers. A dielectric layer is formed over the substrate, the top surface of the metallic lines and the spacers. Finally, a thermal dissociation operation is conducted to remove the spacers, thereby forming an air pocket on each sidewall of the metallic lines.

25 Claims, 2 Drawing Sheets

AIR GAP SEMICONDUCTOR STRUCTURE AND METHOD OF MANUFACTURE

CROSS-REFERENCE TO RELATED APPLICATION

This application claims the priority benefit of Taiwan application serial no. 89127061, filed Dec. 18, 2000.

BACKGROUND OF THE INVENTION

1. Field of Invention

The present invention relates to a metal-oxide-semiconductor structure and corresponding method of manufacture. More particularly, the present invention relates to an air gap semiconductor structure and corresponding method of manufacture.

2. Description of Related Art

Following the rapid reduction of semiconductor line width, the accompanied increase in resistor-capacitor (RC) time delay has greatly reduced the operating speed of integrated circuits. To reduce RC time delay, methods that can lower resistance is frequently adopted. The most common trend now is to replace conventional aluminum wires by copper wires.

A second way of reducing RC time delay is to reduce capacitance between conductive wires in a multi-layer design. Conventional silicon dioxide is no longer versatile enough for this purpose because silicon dioxide has a relatively high dielectric constant. In general, low dielectric constant organic or inorganic material is used to form inter-metal dielectric layers. However, a medium having the lowest dielectric constant is air (a dielectric constant of 1). Therefore, air is an ideal dielectric medium for lowering the capacitance of a capacitor.

Although air is the best dielectric material for lowering capacitance, overall mechanical strength of the device is reduced correspondingly. A weakened structure can have serious effects in various aspects of subsequent integrated circuit fabrication.

FIG. 1 is a schematic cross-sectional view showing a conventional semiconductor device that uses air as a dielectric medium. As shown in FIG. 1, the structure includes a metallic line 102 over a substrate 100. A silicon dioxide layer 104 is attached to the upper surface of the metallic line 102, thereby forming air pockets 106 and 108 that also serve as a dielectric layer.

In the aforementioned implementation, the metallic lines 102 are usually separated from each other by a distance. Air pockets such as 108 may destabilize the semiconductor structure leading to ultimate deformation. Moreover, the air pockets 106 and 108 are normally distributed all over the substrate 100. Although capacitors have low capacitance when air is used as a dielectric medium layer, the poor heat conductivity of air often results in a rapid rise in temperature during operation.

SUMMARY OF THE INVENTION

Accordingly, one object of the present invention is to provide an air gap semiconductor structure and corresponding method of manufacture. The method includes providing a substrate having metallic lines thereon. A high molecular weight sacrificial film is formed over the substrate. A portion of the high molecular weight sacrificial layer is removed to form spacers. A dielectric layer is formed over the substrate, the top surface of the metallic lines and the spacers. Finally, a thermal dissociation operation is conducted to remove the spacers, thereby forming an air pocket on each sidewall of the metallic lines.

In this invention, the air gaps in this invention only form on the sidewall of the metallic lines. Conventional dielectric material fills the other portions of the substrate. With this arrangement, resistor-capacitor delay is reduced and operating speed of the integrated circuit is increased. Yet, the substrate has sufficient mechanical strength to support other structures.

In addition, because only spacer-like air gaps are formed on the sidewalls of the metallic lines, heat generated by the device can easily be conducted away to the surroundings. Hence, heat dissipation problem is minimized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 is a schematic cross-sectional view showing a conventional semiconductor device that uses air as a dielectric medium; and FIGS. 2 through 5 are schematic cross-sectional views showing the progression of steps for producing an air gap semiconductor device according to one preferred embodiment of this invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 2 through 5 are schematic cross-sectional views showing the progression of steps for producing an air gap semiconductor device according to one preferred embodiment of this invention. As shown in FIG. 2, a substrate 200 having a plurality of metallic lines 202 thereon is provided. A high molecular weight sacrificial layer 204 is formed over the metallic lines 202 and the substrate 200. The high molecular weight sacrificial layer 204 has a low dissociation temperature of between 300° C. to 400° C. The sacrificial layer 204 can be polynorbornene formed, for example, by spinning. The substrate 200 can be a semiconductor substrate that includes a plurality of metallic line layers.

As shown in FIG. 3, a portion of the high molecular weight sacrificial layer 204 is removed by back etching to form high molecular weight spacers **204*a* on the sidewalls of the metallic lines 202**.

As shown in FIG. 4, a dielectric layer 206 is formed over the substrate 200, the metallic lines 202 and the high molecular weight spacers **204*a*. The dielectric layer 206** can be a silicon dioxide layer formed, for example, by plasma-enhanced chemical vapor deposition (PECVD) or spin-on-glass (SOG) method.

As shown in FIG. 5, the substrate 200 is put inside a furnace and baked so that the high molecular weight spacers

Figure 1:
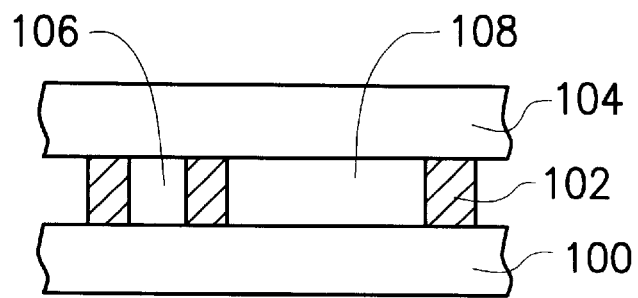
Figure 2:
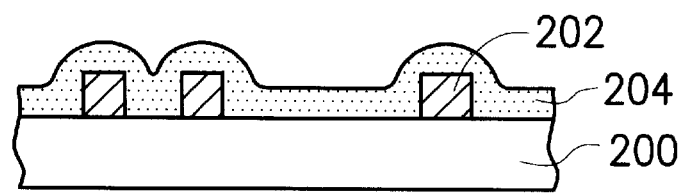
Figure 3:
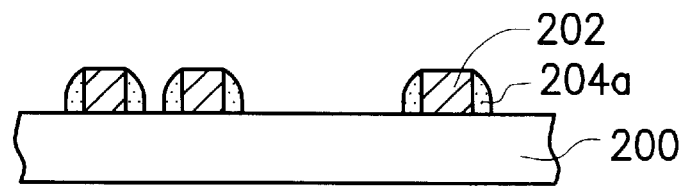
Figure 4:
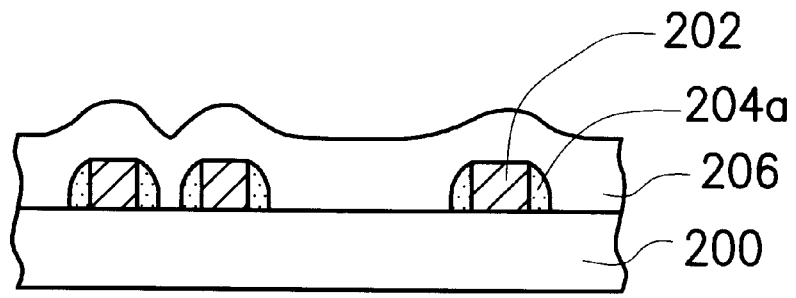
Figure 5:
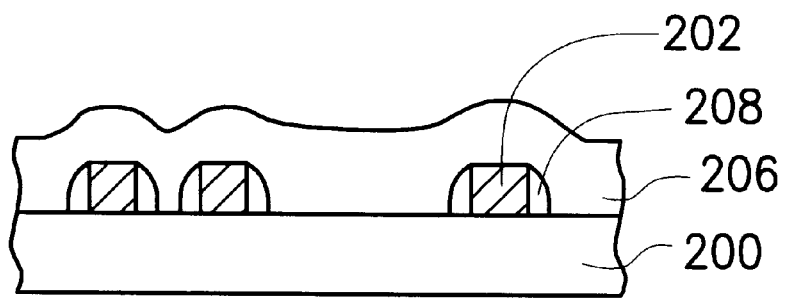

204a dissociate to form small molecular weight side products (not shown). The side products diffuse into the dielectric layer 206, thereby forming air pockets 208 in the original high molecular spacers 204a locations. A temperature of around 400° C. to 450° C. is used in the furnace to dissociate the high molecular weight sacrificial layer.

In conclusion, the advantages of the invention includes:

1. The air gaps in this invention only form on the sidewall of the metallic lines. Conventional dielectric material fills the other portions of the substrate. With this arrangement, resistor-capacitor delay is reduced and operating speed of the integrated circuit is increased. Yet, the substrate has sufficient mechanical strength to support other structures.

2. Since only small spacer-like air gaps are formed on the sidewalls of the metal lines, heat generated by the device can easily be conducted away to the surroundings. Hence, the heat dissipation problem is minimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a semiconductor device having an air packet, comprising the steps of:

providing a substrate having a plurality of metallic lines thereon;

forming a sacrificial layer over the substrate and the metallic lines;

defining the sacrificial layer to form spacers on the sidewalls of the metallic lines, wherein the substrate between the spacers of two metallic lines is exposed;

forming a dielectric layer on the exposed substrate, the metallic lines and the spacers; and removing the spacers to form air pockets instead of the spacers.

2. The method of claim 1, wherein the sacrificial layer is a high molecular compound that can thermally dissociate at a temperature of between 300° C. to 430° C.

3. The method of claim 2, wherein the step of forming the sacrificial layer includes depositing polynorbomene.

4. The method of claim 1, wherein the step of forming the sacrificial layer includes spin-coating.

5. The method of claim 1, wherein the step of removing a portion of the sacrificial layer includes back etching.

6. The method of claim 1, wherein the step of removing the spacers includes the sub-steps of:

dissociating the spacer material by heating to form side products; and permitting the side products to diffuse away via the dielectric layer.

7. The method of claim 6, wherein the temperature for dissociating the spacer material is set between 400° C. to 450° C.

8. The method of claim 1, wherein the substrate is a semiconductor substrate that has a plurality of metallic layers.

9. The method of claim 1, wherein the step of forming the dielectric layer includes chemical vapor deposition.

10. The method of claim 1, wherein the step of forming the dielectric layer includes a spin-on-glass (SOG) operation.

11. The method of claim 1, wherein the step of forming the dielectric layer includes depositing silicon dioxide.

12. A semiconductor device having an air spacer, comprising:

a substrate having a plurality of spaced metallic lines thereon; and a dielectric layer covering the metallic lines and filled between the metallic lines, with a plurality of air spacers interposed between the dielectric layer and the sidewalls of the metallic lines.

13. The device of claim 12, wherein the substrate includes a semiconductor substrate that has a plurality of interconnect layers.

14. The device of claim 12, wherein the dielectric layer is a silicon dioxide layer formed by plasma-enhanced chemical vapor deposition.

15. The device of claim 12, wherein the dielectric layer is a silicon dioxide layer formed by a spin-coating process.

16. A method of manufacturing a semiconductor device having an air pocket, comprising:

providing a substrate having a plurality of metallic lines thereon;

forming a sacrificial layer over the substrate and the metallic lines;

etching back the sacrificial layer to form spacers on the sidewalls of the metallic lines and to expose the substrate between the spacers of two metallic lines;

forming a dielectric layer on the exposed substrate, the metallic lines and the spacers; and removing the spacers to form air pockets instead of the spacers.

17. The method of claim 16, wherein the sacrificial layer is a high molecular compound that can thermally dissociate at a temperature of between 300° C. to 430° C.

18. The method of claim 17, wherein the step of forming the sacrificial layer includes depositing polynorbomene.

19. The method of claim 16, wherein the step of forming the sacrificial layer includes spin-coating.

20. The method of claim 16, wherein the step of removing the spacers includes the substeps of:

dissociating the spacer material by heating to form side products; and permitting the side products to diffuse away via the dielectric layer.

21. The method of claim 20, wherein the temperature for dissociating the spacer material is set between 400° C. to 450° C.

22. The method of claim 16, wherein the substrate is a semiconductor substrate that has a plurality of metallic layers.

23. The method of claim 16, wherein the step of forming the dielectric layer includes chemical vapor deposition.

24. The method of claim 16, wherein the step of forming the dielectric layer includes a spin-on-glass (SOG) operation.

25. The method of claim 16, wherein the step of forming the dielectric layer includes depositing silicon dioxide.

* * * * *